United States Patent
Feustel et al.

(10) Patent No.: US 7,306,976 B2
(45) Date of Patent: Dec. 11, 2007

(54) TECHNIQUE FOR ENHANCING THERMAL AND MECHANICAL CHARACTERISTICS OF AN UNDERFILL MATERIAL OF A SUBSTRATE/DIE ASSEMBLY

(75) Inventors: Frank Feustel, Dresden (DE); Matthias Lehr, Dresden (DE); Frank Kuechenmeister, Dresden (DE)

(73) Assignee: Advanced Micro Devices, Inc., Austin, TX (US)

( * ) Notice: Subject to any disclaimer, the term of this patent is extended or adjusted under 35 U.S.C. 154(b) by 103 days.

(21) Appl. No.: 11/284,292

(22) Filed: Nov. 21, 2005

(65) Prior Publication Data
US 2006/0246627 A1 Nov. 2, 2006

(30) Foreign Application Priority Data
Apr. 29, 2005 (DE) ............ 10 2005 020 059

(51) Int. Cl.
*H01L 21/48* (2006.01)
(52) U.S. Cl. ............... 438/127; 257/E21.503
(58) Field of Classification Search ............ None
See application file for complete search history.

(56) References Cited

U.S. PATENT DOCUMENTS

| | | | |
|---|---|---|---|
| 4,872,047 A * | 10/1989 | Fister et al. | 257/747 |
| 5,981,313 A | 11/1999 | Tanaka | 438/118 |
| 6,030,854 A | 2/2000 | Mashimoto et al. | 438/106 |
| 6,049,038 A | 4/2000 | Suzuki | 174/52.2 |
| 6,338,981 B1 | 1/2002 | Klocke et al. | 438/112 |
| 6,373,142 B1 | 4/2002 | Hoang | 257/783 |
| 6,929,980 B2 * | 8/2005 | Chiu et al. | 438/108 |
| 7,087,994 B2 * | 8/2006 | Lee | 257/734 |
| 2002/0167077 A1 | 11/2002 | Vincent | 257/684 |
| 2006/0068521 A1 * | 3/2006 | Shi et al. | 438/108 |

OTHER PUBLICATIONS

Darbha et al., "Impact of Underfill Filler Particles on Reliability of Flip-Chip Interconnects," *IEEE Transactions on Components, Packaging and Manufacturing Technology-Part A*, 21:275-80, 1998.

Huang et al., "Fill Pattern and Particle Distribution of Underfill Material," *IEEE Transactions on Components and Packaging Technologies*, 27:493-98, 2004.

* cited by examiner

*Primary Examiner*—Scott B. Geyer
(74) *Attorney, Agent, or Firm*—Williams, Morgn & Amerson

(57) ABSTRACT

During the formation of an underfill material provided between a carrier substrate and a semiconductor chip, a common motion of particles contained in the underfill material is initiated towards the semiconductor chip, thereby adjusting the thermal and mechanical behavior of the underfill material. For instance, by applying an external force, such as gravity, a depletion zone with respect to the filler particles may be created in the vicinity of the carrier substrate, while a high particle concentration may be obtained in the vicinity of the semiconductor chip. Hence, thermal and mechanical stress redistribution by means of the underfill material may be enhanced.

18 Claims, 2 Drawing Sheets

TECHNIQUE FOR ENHANCING THERMAL AND MECHANICAL CHARACTERISTICS OF AN UNDERFILL MATERIAL OF A SUBSTRATE/DIE ASSEMBLY

BACKGROUND OF THE INVENTION

1. Field of the Invention

The present invention relates to the field of fabrication of semiconductor devices, and, more particularly, to packaging circuit chips by attaching a carrier substrate to a chip using an underfill material.

2. Description of the Related Art

As semiconductor manufacturers continue to scale down on-chip features, the need to contact those reduced size features becomes a more significant constraint. The number of scaled features provided for increased functionality, i.e., in general, the number of inputs and outputs (I/O count) of an integrated circuit, may be increased while maintaining the chip size or, on the other hand, the chip size may be reduced while maintaining the functionality (and the I/O count) of the integrated circuit. In both cases, however, the density of inputs and outputs (I/Os) is increased. For a conventional peripheral bond pad arrangement, the resulting bond pad pitch, i.e., the distance between the center of two adjacent bond pads, is accordingly reduced.

Semiconductor devices including integrated circuitry are typically formed on appropriate substrates or wafers, such as silicon wafers, silicon-on-insulator (SOI) wafers, glass wafers and the like, wherein usually a large number of individual semiconductor devices, such as CPUs, memory chips, ASICs (application specific ICs) and the like, are formed simultaneously on the wafer. Depending on the complexity of the semiconductor devices under consideration, up to 500 or more interrelated processes may be required to complete the semiconductor devices on wafer level. Due to economical constraints, feature sizes of individual circuit elements, such as transistors, are continuously being scaled, thereby increasing package density per unit area of the wafer, while, at the same time, wafers of increased surface area are employed to enhance production yield, since most of the highly complex manufacturing processes may be performed on wafer basis rather than die basis. Typically, as package densities of the individual circuit elements increase, the complexity of the individual semiconductor devices may also increase, thereby frequently requiring an increased number of input/output terminals for contacting the periphery.

Packaging of the individual semiconductor devices after dicing the wafer also plays an important role in view of cost efficiency of the overall manufacturing process, as well as with respect to device performance and reliability. A packaging technique has recently become a standard procedure, at least for highly complex semiconductor devices, in which each semiconductor device is provided with a specifically designed contact layer, also often referred to as a "bump layer." The bump layer typically includes a plurality of contact pads, with adhesive bumps or solder bumps which may provide thermal or electrical contact to underlying circuit elements or which may be provided in view of mechanical stability of the semiconductor device in the package. The semiconductor device may then be directly attached to an appropriate carrier substrate or printed wiring board, which has a contact pad array that matches the layout of the bump layer of the semiconductor device, wherein the bonding of the carrier substrate and the semiconductor device may be accomplished by reflowing the bump material or adhesive, thereby substantially simultaneously contacting all of the solder bumps with the respective contact pads on the carrier substrate.

Thus, contrary to traditional wire bonding techniques, extremely short electrical connections between the semiconductor device and the carrier substrate are accomplished in a highly efficient manner, thereby providing low ohmic connections with low parasitic inductance, wherein additionally, the entire semiconductor surface is substantially available for providing contact areas, contrary to the traditional wire bonding techniques that are substantially restricted to the chip perimeter.

Despite the many advantages of this packaging technique compared to, for instance, conventional wire bonding techniques, problems may arise from the fact that the characteristics of the substrate material may significantly influence the overall performance of the packaged semiconductor device. In particular, the coefficient of thermal expansion (CTE), the conductor resistivity, the dielectric constant, the dielectric loss tangent and the thermal conductivity of the carrier substrate material may have to be taken into consideration when selecting appropriate carrier materials to appropriately balance material costs against device performance and reliability. For example, a mismatch in the coefficient of thermal expansion between the package or the printed wiring board and the die has a significant influence on product reliability. The mismatch in thermal expansion may generate shear stresses, which, in turn, may cause failure in the electrical connections.

FIG. 1 schematically shows a cross-sectional view of a semiconductor device 100 including a semiconductor chip 110 that is directly connected to a carrier substrate 120. The semiconductor chip 110 may comprise a plurality of contact pads 111 arranged in a corresponding pattern which matches a corresponding pattern of contact pads 121 formed on the carrier substrate 120. Corresponding contact pads 111 and 121 may be connected by a solder material 130 or a conductive adhesive material, thereby providing an electrical connection, also referred to as 130, between the semiconductor chip 110 and the carrier substrate 120. Moreover, in many semiconductor devices, including a semiconductor chip and a carrier substrate that are directly attached to each other, a fill material may be provided between the two components to enhance thermal and mechanical characteristics, as well as the integrity with respect to environmental influences.

In the example shown, a fill material, also referred to as underfill material 140, is provided between the semiconductor chip 110 and the carrier substrate 120. The underfill material 140 may comprise particles 141, which may substantially determine the thermal and mechanical characteristics of the underfill material 140, such as the thermal conductivity and the coefficient of thermal expansion. The underfill material 140 is provided in many applications to compensate for the differences in coefficients of thermal expansion between the semiconductor chip 110 and the carrier substrate 120. For example, the semiconductor chip 110 may be substantially comprised of a semiconductive material, such as silicon, and may have a coefficient of thermal expansion of approximately three parts per million per degree Celsius (ppm/C.), while the carrier substrate 120 may have a different coefficient, such as a difference of a few ppm/C. for an alumina ceramic substrate and may be as high as approximately 17-22 ppm/C. for an organic substrate comprised of FR4, which is frequently used due to its high cost efficiency and superior high frequency characteristics. Consequently, by coupling substantially the entire area of the semiconductor chip 110 to the substrate carrier 120, the effective thermal mechanical stress created during the operation of the semiconductor device 110 creates a "gradient" of the effective composite coefficient of thermal expansion between the semiconductor chip 110 and the carrier substrate 120, thereby increasing the reliability of the device 110, because the probability of a premature failure in one of the electrical connections 130 is significantly reduced.

A typical process flow for forming the device 110 may be carried out as follows. After the completion of the semiconductor chip 110 by forming circuit elements (not shown) and respective metallization layers (not shown), which are electrically connected to at least some of the contact pads 111, including solder bumps or solder balls, the corresponding chips 110 are diced to provide the individual semiconductor chip 110. Thereafter, the carrier substrate 120 and the semiconductor chip 110 are aligned to each other, contacted and heat treated to reflow the solder bumps or solder balls or any other bumps comprised of conductive adhesive to form the electric connections 130. Next, a precursor of the underfill material 140, for instance, in the form of a viscous epoxy containing the particles 141, which may be provided in the form of silica particles, is applied by dispensing a liquid precursor material along a single edge or along two adjacent edges of the gap between the semiconductor chip 110 and the carrier substrate 120. Surface tension then draws the liquid precursor material under the chip and through the array of electrical connections 130. Since the liquid flow is substantially governed by capillary flow, the entire process of distributing the liquid precursor material between the semiconductor chip 110 and the carrier substrate 120 may take several minutes, wherein the fluid flow is affected by the gap width, the pattern configuration of the electrical connections 130, the substrate temperature and gradients, the viscosity of the liquid precursor material, flux contamination, the dispense pattern used for applying the liquid precursor material, and the like. Thereafter, the device 110 may be heat-treated, for instance, in an oven, at temperatures from approximately 130-175° C. to cure the liquid precursor material and to form the underfill material 140. During the process of filling in the liquid precursor material, as well as during the heat treatment for curing the liquid, the particles 141 may move and accumulate at an interface 122 between the material 140 and the underlying carrier substrate 120. Since the particles 141 may significantly affect the thermal and mechanical characteristics of the underfill material 140, for instance, the coefficient of thermal expansion, undue thermomechanical stress may be created during the operation of the device 110, since the coefficient of thermal expansion of the underfill material 140 may be low at the interface 122 due to the accumulated particles 141, whereas the coefficient of thermal expansion of the underlying carrier substrate 120 may be significantly higher, thereby deteriorating the capability of thermal and mechanical stress "redistribution" of the underfill material 140.

In view of the situation described above, a need exists for an enhanced technique that enables the formation of packaged semiconductor devices having an underfill material, wherein one or more of the problems identified above, or at least the effects thereof, may be avoided or reduced.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

The present invention is generally directed to a technique that enables the formation of packaged semiconductor devices with a direct electrical connection between a semiconductor chip and a carrier substrate with an underfill material disposed therebetween, wherein the thermal and mechanical characteristics of the underfill material may be adjusted more efficiently compared to conventional techniques. For this purpose, the collective motion of particles contained in the underfill material may be controlled by an external force to adjust a concentration profile of the particles within the underfill material.

According to one illustrative embodiment of the present invention, a method comprises attaching a carrier substrate to a semiconductor chip having formed therein an integrated circuit. Moreover, a viscous underfill material is provided between the carrier substrate and the semiconductor chip, wherein the underfill material contains particles. Additionally, a distribution of the particles in the underfill material is adjusted by applying an external force to obtain, at least temporarily, a collective motion of the particles toward the semiconductor chip.

According to another illustrative embodiment of the present invention, a semiconductor device comprises a carrier substrate and a semiconductor chip attached to the carrier substrate. The semiconductor device further comprises an underfill material including particles, wherein the underfill material is disposed between a portion of the carrier substrate and a portion of the semiconductor chip, whereby the underfill material forms a first interface with the carrier substrate and a second interface with the semiconductor chip. Moreover, a concentration of the particles at the first interface is equal to or less than a concentration of the particles at the second interface.

BRIEF DESCRIPTION OF THE DRAWINGS

The invention may be understood by reference to the following description taken in conjunction with the accompanying drawings, in which like reference numerals identify like elements, and in which.

Figure 1:
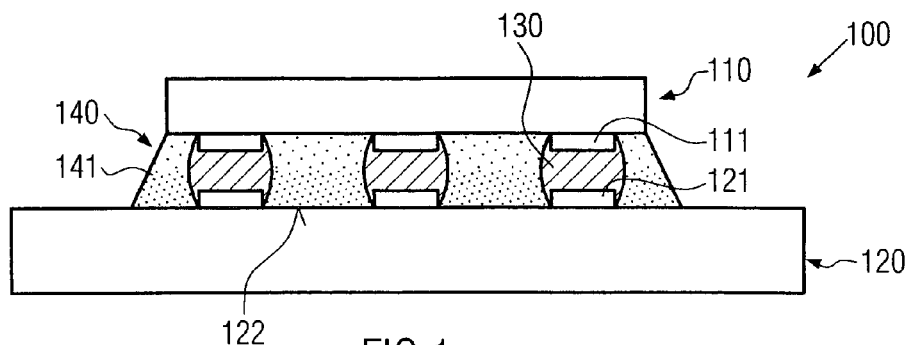
FIG. 1 schematically shows a cross-sectional view of a conventional packaged semiconductor device with an underfill material provided between a semiconductor chip and a carrier substrate.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Various structures, systems and devices are schematically depicted in the drawings for purposes of explanation only and so as to not obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present invention is based on the concept that, in the formation of an underfill material, including particles which are typically provided to adjust the overall thermal and mechanical characteristics of the underfill material, the concentration of the particles within the underfill material may be adjusted or controlled on the basis of an external force that is commonly exerted on the particles, thereby creating a common motion or common drift motion of the particles. As previously discussed, the direct connection of a semiconductor device and a carrier substrate may, during operation of the device, lead to excessive thermo-mechanical stresses when the coefficients of thermal expansion of both components are significantly different from each other. The underfill material formed between these components may reduce these stresses, wherein, however, compared to the conventional process technique, an enhanced flexibility in adjusting the concentration of particles within the underfill material may significantly enhance the capability of thermal and mechanical stress redistribution of the underfill material. Therefore, an external force is applied, at least during a portion of the manufacturing process, in providing the underfill material between the semiconductor chip and the carrier substrate, wherein, at least temporarily, a common motion towards the carrier substrate is created. In this respect, an external force is to be understood as a force that acts on each of the particles equally, which may result in an averaged common motion in a specified direction, given by the direction of the external force, irrespective of any irregular internal motion of the particles that may be caused by heat, internal attractive or repulsive forces, and the like. For instance, gravity may be considered as an external force in this respect.

Figure 2A:
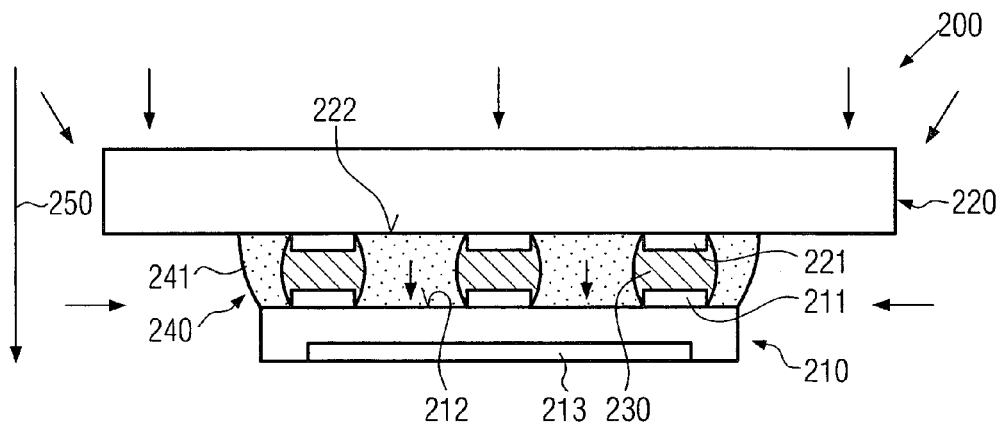
FIGS. 2A and 2B schematically show cross-sectional views of a packaged semiconductor device at different manufacturing stages in accordance with illustrative embodiments of the present invention.

FIG. 2A schematically shows a cross-sectional view of a semiconductor device 200 in an advanced manufacturing stage. The semiconductor device 200 comprises a semiconductor chip 210, which may have formed therein an integrated circuit 213 that is electrically connected to at least some of the contact pads 211. The semiconductor chip 210 may represent any chip, including a substrate, such as a silicon-based substrate, a gallium arsenide substrate, an indium phosphate substrate, a germanium substrate, a glass substrate, and the like, having formed thereon or therein microstructure features, including at least some electrical circuit elements to form the integrated circuit 213, which may act as a heat source during operation of the device 200. The semiconductor device 200 further comprises a carrier substrate 220, which may include a plurality of conductive lines and vias, which may be arranged in one or more levels. The carrier substrate 220 may have formed thereon a plurality of contact pads 221, at least some of which may correspond to the pattern of contact pads 211 formed on the semiconductor chip 210. The carrier substrate 220 may be substantially comprised of an appropriate material, such as an organic material, for instance, FR4, and the like, as is frequently used as base material for printed wiring boards. In other embodiments, the carrier substrate 220 may be comprised of other materials, such as ceramic materials and the like. Furthermore, an averaged coefficient of thermal expansion of the carrier substrate 220 may differ from a respective averaged coefficient of thermal expansion of the semiconductor chip 210, wherein the magnitude of the difference is substantially determined by the base material of the carrier substrate 220. In one illustrative embodiment, the carrier substrate 220 may be formed from an organic base material having a coefficient of thermal expansion in the range of approximately 15-25 ppm/C.

The device 200 further comprises electrical connections 230, formed of, for instance, solder material or conductive adhesive, wherein the electrical connections 230 provide contact between corresponding contact pads 221 and 211. Moreover, a viscous precursor material 240 of an underfill material is provided between portions of the carrier substrate 220 and portions of the semiconductor chip 210, wherein, for convenience, the underfill material and any viscous precursor thereof are indicated by 240. The material 240 contains particles 241, which may typically be added to substantially determine at least the thermal and mechanical characteristics of the material 240. The material 240 forms a first interface 222 with portions of the carrier substrate 220 and also forms a second interface 212 with portions of the semiconductor chip 210. Moreover, the semiconductor device 200 is disposed substantially vertically in such a way that the semiconductor chip 210 is positioned below the carrier substrate 220, thereby creating an external force 250, i.e., in this case gravity, resulting in a common drift motion of the particles 241, which may be moveable within the material 240 when it is still in the viscous state. It should be appreciated that the components of the particle velocity directed toward the interface 212 may depend on the magnitude of the viscosity of the material 240, the type and the size of the particles 241, and the like. Typically, the viscosity of the material 240 may be selected in view of fill characteristics, i.e., capillary flow characteristics, rather than drift speeds of the particles 241.

A typical process for forming the semiconductor device 200 as shown in FIG. 2A may comprise the following processes. After the formation of the semiconductor chip 210 and the carrier substrate 220, both components may be aligned to each other, contacted and connected by performing a heat treatment to reflow a solder material or a conductive adhesive provided on the contact pads 211 or on both the contact pads 211 and the contact pads 221, thereby forming the electrical connections 230. In other embodiments, the material 240 may be provided on the carrier substrate 220 or on the semiconductor chip 210, or on both, to substantially cover the respective contact pads and solder material or conductive adhesive material. Thereafter, the semiconductor chip 210 and the carrier substrate 220 may be aligned and may be bonded by heat treating the device 200 to reflow the corresponding solder material or conductive adhesive, thereby forming the electrical connections 230. In some techniques, the contact pads 211 and 221 may directly be connected by non-conductive adhesive. In some embodiments, the process of connecting the carrier substrate 220 and the semiconductor chip 210 may be performed with the device 200 being in a specified spatial orientation, which may differ from the substantially vertical orientation as shown in FIG. 2A. For instance, the process may be performed with the device 200 being substantially vertically oriented, wherein, however, the semiconductor chip 210 is located on top of the device 200. In the embodiments in which the material 240 is provided after bonding the carrier substrate 220 to the semiconductor chip 210, the viscous precursor material 240 may be filled into the gap between the two components to at least partially fill the available space, and form, at least locally, the first interface 222 and the second interface 212. As previously explained, the material 240 may be filled in by application to one or more edges of the gap, thus allowing the material 240 to continuously fill in the space by capillary flow, as is also described with respect to FIG. 1. In other embodiments, the liquid material 240 may be applied by injecting it directly into the gap by any appropriate injector means, as is well known in the art. Moreover, in still other embodiments, an appropriate injection mold may be formed around the semiconductor chip 210 and the mold may be filled with the liquid material 240.

Thereafter, the liquid material 240 may be allowed to solidify, which, according to some embodiments, may be accomplished by heat treating the device 200, thereby curing the material 240. Thereby, prior to substantially solidifying the material 240, the device 200 is substantially oriented as shown in FIG. 2A to allow the particles 241 to drift toward the second interface 212, thereby increasing the concentration of the particles 241 in the vicinity of the interface 212. In some embodiments, the substantially vertical orientation of the device 200 with the semiconductor chip 210 positioned below is used at least in the initial phase of the curing process, since in this phase, the mobility of the particles 241 may be significantly higher than at a later stage of the curing process. The degree of concentration increase at the interface 212 may be controlled by controlling the temperature of the curing process, since the temperature may determine the rate of solidification of the material 240. Thus, a time period of high particle mobility may be controlled by appropriately selecting the curing temperature. In view of throughput, however, a rapid application of the underfill material 240 may be desirable, so that, for a given viscosity and configuration of the particles 241, in some embodiments, the material 240 may be applied with the device 200 being oriented as shown in FIG. 2A, thereby initiating the particle drift towards the interface 212 during the application of the material 240 and during the entire curing process.

Figure 2B:
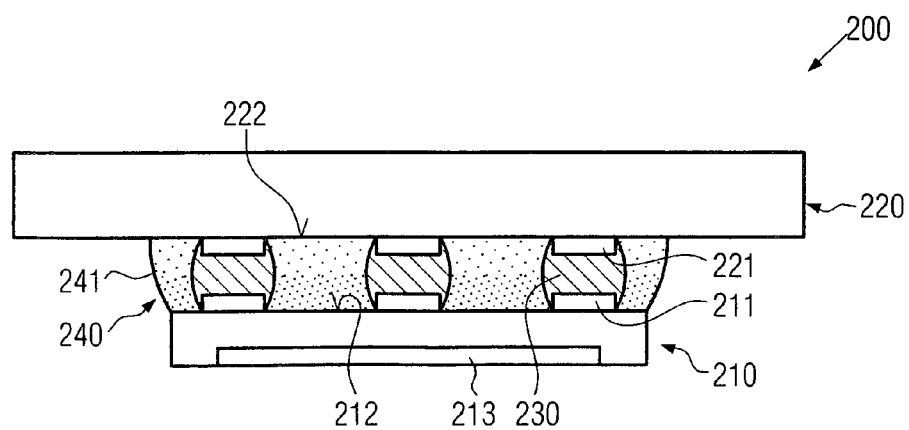

FIG. 2B schematically shows the device 200 after solidification of the underfill material 240. Due to the external force 250 affecting a particle drift towards the interface 212, the underfill material 240 exhibits a concentration gradient with an increased particle concentration at the interface 212, which is at least equal to or greater than a corresponding particle concentration at the interface 222. In one particular embodiment, the concentration of the particles 241 at the interface 212 may be higher than the respective concentration at the interface 222, thereby endowing the underfill material 240 with a locally varying coefficient of thermal expansion, which is low at the interface 212 and which increases towards the interface 222. Consequently, thermomechanical stress created during the operation of the device 200 when the integrated circuits 213 may generate heat is reduced at the interface 212, thereby creating a substantially "smooth" transition from the semiconductor chip 210 to the underfill material 240 with respect to the thermal and mechanical characteristics. Similarly, the underfill material 240 exhibits an increased coefficient of thermal expansion at the interface 222, thereby providing a moderately smooth transition to the carrier substrate 220, since the carrier substrate 220 may typically have a significantly higher thermal expansion than the semiconductor chip 210. Thus, the thermal and mechanical stress redistribution effect of the underfill material 240 and thus the overall reliability of the electrical connections 230 may be significantly enhanced by the modified distribution of the particles 241 compared to the conventional device as described with reference to FIG. 1.

Figure 3A:
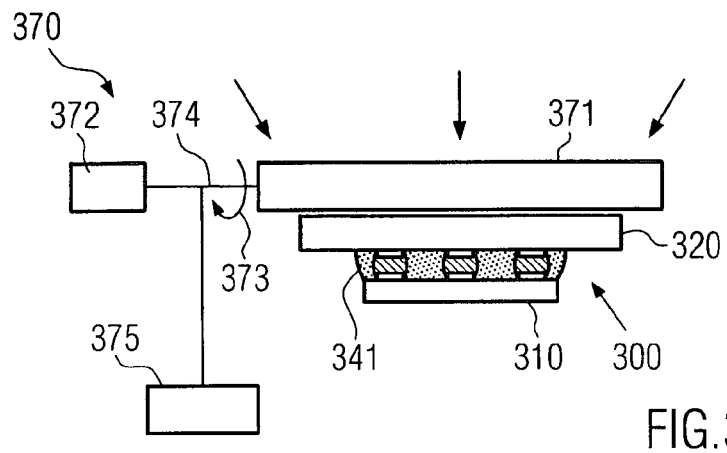
FIGS. 3A and 3B schematically show a semiconductor device during the formation of an underfill material between a semiconductor chip and a carrier substrate in accordance with further illustrative embodiments of the present invention.

FIG. 3A schematically shows a semiconductor device 300 including a carrier substrate 320 and a semiconductor chip 310 with an underfill material 340 disposed therebetween. The semiconductor device 300 is shown in a manufacturing stage in which the underfill material is cured by applying heat, as indicated by the arrows, wherein the distribution of particles 341 is controlled by applying an external force, in this embodiment gravity, to control the corresponding drift velocity of the particles 341. For this purpose, the semiconductor device 300 is processed in a tool 370 comprising a substrate holder 371 that is configured to hold the semiconductor device 300 in position irrespective of its absolute orientation in space. The substrate holder 371 is coupled to a drive assembly 372 that is configured to at least rotate the substrate holder 371, as indicated by arrow 373. In the example shown, the rotation 373 may be performed around a substantially horizontally aligned rotation axis 374. Moreover, the drive assembly 372 and the substrate holder 371 are supported by a base station 375.

For the formation of the underfill material 340, the device 300 may be mounted on the substrate holder 371, and the drive assembly 372 may be instructed to rotate the substrate holder 371 to bring the device 300 in a position, in which, at least temporarily, a drift velocity of the particles 341 is directed towards the semiconductor chip 310 caused by gravity. In other embodiments, the tool 370 may also be used for applying the underfill material 340, wherein the device 300 may be brought in any spatial orientation that is appropriate for applying the material 340 according to any of the methods described before with reference to FIGS. 1, 2A and 2B.

Figure 3B:
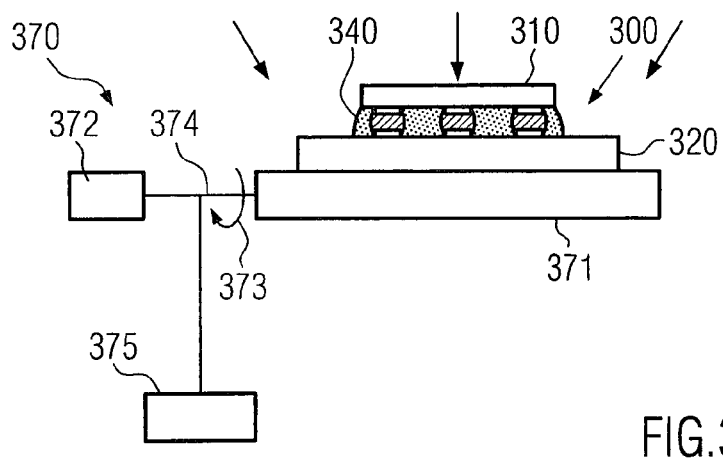

FIG. 3B schematically shows the tool 370 in a different operating position, thereby orienting the semiconductor device 300 to change the drift velocity of the particles 341. For instance, as is shown, the semiconductor device 300 may be oriented substantially opposite to the orientation shown in FIG. 3A, thereby creating a drift velocity of the particles 341 that is substantially directed to the carrier substrate 320. As previously discussed, the drift velocity caused by gravity may be substantially determined by the characteristics of the underfill material 340, such as the viscosity, the size and type of the particles 341 and the like, wherein these characteristics may be substantially determined in view of throughput aspects, rather than with respect to the drift behavior of the particles 341 during solidification of the underfill material 340. Thus, by varying the orientation of the semiconductor device 300 during the process of solidifying and, in other embodiments, also during the application of the underfill material 340, the finally obtained concentration profile within the underfill material 340 may be controlled. For example, if a substantially uniform particle concentration is required, the orientation of the semiconductor device 300 may be changed, continuously or intermittently, to substantially cancel the effect of gravity on the averaged drift velocity of the particles 341. In other situations, a less pronounced concentration gradient compared to the device shown in FIG. 2B may be required and, hence, by at least temporarily orienting the semiconductor device 300 as shown in FIG. 3B, the overall common motion of the particles 341 toward the semiconductor chip 310 may be reduced in an appropriate manner. In this case, the continuously increasing degree of solidification and, thus, of reduced mobility of the particles 341, during the curing process may be taken into consideration by correspondingly adapting the time periods of the different orientations.

As previously mentioned, efforts are being made to accelerate the process of applying an underfill material and curing the same to increase the overall process throughput, thereby lowering overall manufacturing costs. Consequently, underfill materials may be used that exhibit moderately short curing periods while, nevertheless, providing the required flow characteristics during the application of the material. In this situation, or for any other reasons, it may be convenient to provide an external force, the magnitude of which may be controllable to allow a direct effect on the common drift velocity of the particles in the underfill material substantially independent from gravity. If an external force averaged over time is required that is less than that obtained by orienting the device permanently in a way as is shown in FIG. 2a, the procedure described above may be applied and the orientation of the device may correspondingly be changed continuously or intermittently. For higher external forces compared to gravity, a technique may be applied wherein a centrifugal force is used.

Figure 4:
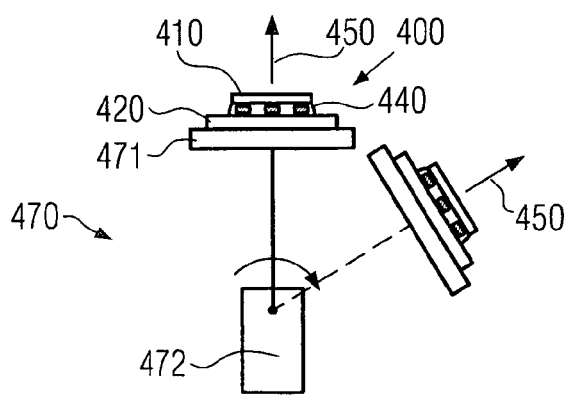
FIG. 4 schematically depicts a semiconductor device during the formation of an underfill material during the application of a controllable external force in accordance with other illustrative embodiments of the present invention.

FIG. 4 schematically shows a centrifuge 470 comprising a substrate holder 471 connected to a drive assembly 472 that is configured to continuously rotate the substrate holder 471, thereby exerting a centrifugal force on a semiconductor device 400 supported by the substrate holder 471. During operation of the centrifuge 470, the substrate holder 471 is rotated according to a specified angular velocity, which may be varied during operation of the centrifuge 470, thereby creating an external force 450 that drives any particles within an underfill material 440 toward a semiconductor chip 410 and away from a carrier substrate 420. The magnitude of the external force 450 depends on the geometrical configuration of the centrifuge 470, i.e., on the distance of the semiconductor device 400 from an axis of rotation, and on the angular velocity. Consequently, by appropriately adjusting the angular velocity and/or the distance between center of rotation and the device 400, the external force 450 may be controlled to obtain the desired distribution of the particles in the underfill material 440, irrespective of the characteristics of the underfill material 440 and the duration of the entire process of solidifying the material 440. It should be appreciated that the centrifuge 470 may be operated in an ambient providing elevated temperatures at the semiconductor device 400 so as to not unduly delay the solidification of the material 440. Moreover, the process of applying the material 440 to the semiconductor device 400 may also be performed in the centrifuge 470 with a specific predetermined position, wherein after application of the material 440, a specific mode of operation may be initiated to enhance the flow behavior of the material 440 when moving through the interconnect pattern of the device 400. For example, after applying the liquid underfill material 440 at a single edge with the device 400 oriented substantially horizontally, the drive assembly 472 may be instructed to change the orientation by moving the substrate holder 471 according to a predefined angle such that the fluid flow into the interconnect pattern is enhanced by gravity. In other regimes, the spatial orientation of the device 400 may be changed more frequently, thereby promoting the fill capability of the liquid underfill material 440, depending on its viscosity and flow characteristics. Thereafter curing of the underfill material 440 may be initiated by, for instance, supplying radiation heat or by convection and the like, wherein any appropriate motional state may be initiated by correspondingly controlling the drive assembly 472 to generate the external force 450 with a desired magnitude. Thus, even for the fast curing of underfill materials 440, a desired distribution of particles contained therein may be obtained, since the external force 450 may be virtually adjusted to any appropriate value.

As previously discussed, the distribution of particles within an underfill material, such as the particles 241 and the material 240 (see FIGS. 2A and 2B), significantly affects the thermal and mechanical performance of the semiconductor device, thereby having a significant impact on the overall electrical performance and reliability of the device. Consequently, a plurality of target distributions for the particles 241 may be established for a given underfill material 240 to tailor the thermal and mechanical behavior of the semiconductor device with respect to application-specific goals. Even though the particle distribution as shown in FIG. 2B is generally advantageous in many applications, other target distributions may be desirable in other applications.

Figure 5:
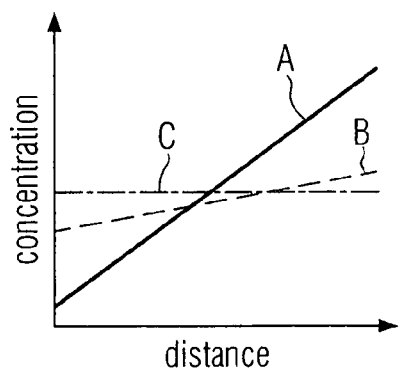
FIG. 5 depicts a graph representing a plurality of target particle distributions that may be used in controlling an external force for adjusting a particle concentration in an underfill material according to illustrative embodiments of the present invention.

FIG. 5 schematically shows three different exemplary target distributions of the particles 241 in the underfill material 240, wherein the horizontal axis represents the distance between the interface 222 and the interface 212 starting at the interface 222. For example, Curve A may qualitatively represent the distribution of the particles 241 as shown in FIG. 2B, wherein near the interface 222, a substantially "depleted" zone is formed with a continuously increasing concentration having its maximum at the interface 212. Consequently, the coefficient of thermal expansion of the underfill material 240 may qualitatively have a similar, but inverted, behavior, that is, the thermal expansion at the interface 222 may be highest and may decrease so as to have its minimum value at the interface 212. Similarly, Curve B represents a distribution having a less pronounced difference compared to Curve A. Curve C, on the other hand, represents a substantially uniform distribution, which may be appropriate for applications with a small difference in the coefficients of thermal expansion between the carrier substrate 220 and the semiconductor chip 210. Appropriate target distributions may be obtained from empirical data, from which a correlation between performance specific aspects and the target distributions, such as the distributions A, B and C, may be established. For instance, reliability analysis may reveal that a target distribution represented by Curve A may produce superior results for a given underfill material in combination with an organic carrier substrate 220 and a silicon chip 210. Consequently, the above process steps for forming the underfill material as described with reference to FIGS. 2A, 2B, 3A, 3B and 4 may be correspondingly controlled on the basis of the respective target distribution. For instance, with a specific underfill material in combination with a specific application and cure strategy, it may not be possible to obtain the target distribution of Curve A only by the influence of gravity, as is the case in embodiments of FIGS. 2A, 2B and 3A, 3B, so that a method as described with reference to FIG. 4 may be used to provide a sufficiently high external force 450 to obtain sufficiently high drift velocities of the respective particles to obtain the desired target distribution. If, on the other hand, particles in the underfill material may receive a moderately high drift velocity under given application and curing conditions with the upside-down orientation shown in FIGS. 2A, 2B and 3A, so that an undesired large depletion zone would result at the interface 222, at least the curing process may be controlled to reduce the influence of gravity by temporarily orienting the semiconductor device opposite to that shown in FIG. 3B, to finally obtain the desired target distribution. Corresponding control strategies for controlling the influence of the external force on the drift velocity of the particles in the underfill material so as to obtain a specified target distribution may be obtained by experiments and/or theoretical models.

As a result, the present invention provides a technique for forming an underfill material that contains particles influencing the thermal and mechanical behavior of the underfill material, wherein at least temporarily an external force is applied to create a common motion towards the interface between the underfill material and the semiconductor device, thereby offering the potential for controllably adapting the thermal and mechanical characteristics of the underfill material to process and device specific requirements. In particular embodiments, a substantially particle depleted zone may be created at the interface between the underfill material and the carrier substrate so as to endow the underfill material at this interface with a high coefficient of thermal expansion, while the particle concentration at the opposite interface between the underfill material and the semiconductor chip exhibits a significantly lower coefficient of thermal expansion. Moreover, the orientation of the semiconductor device, at least during curing of the underfill material, may be changed to obtain a desired target distribution, wherein at least temporarily a common drift motion of the particles towards the carrier substrate is achieved.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method, comprising:
attaching a carrier substrate to a semiconductor chip having formed therein an integrated circuit;
providing a viscous underfill material between the carrier substrate and the semiconductor chip, said underfill material containing particles; and
adjusting a distribution of said particles in the underfill material by applying an external force to obtain, at least temporarily, a collective motion of said particles towards said semiconductor chip.

2. The method of claim 1, wherein said external force is substantially represented by gravity.

3. The method of claim 2, further comprising curing said underfill material, wherein, during curing said underfill material, said carrier substrate and said semiconductor chip are, at least temporarily, substantially vertically disposed, with said semiconductor chip being positioned below said carrier substrate.

4. The method of claim 1, wherein attaching said carrier substrate to said semiconductor chip comprises bonding said carrier substrate to said semiconductor chip by connecting one of bumps and contact pads formed on said semiconductor chip with one of bumps and contact pads formed on said carrier substrate.

5. The method of claim 4, wherein said underfill material is provided prior to connecting one of said bumps and contact pads formed on said semiconductor chip with one of said bumps and contact pads formed on said carrier substrate.

6. The method of claim 4, wherein said underfill material is filled in after bonding said carrier substrate to said semiconductor chip.

7. The method of claim 4, wherein bonding said carrier substrate to said semiconductor chip is performed with a specified spatial orientation of said carrier substrate with respect to said semiconductor chip, said method further comprising changing said specified spatial orientation for adjusting said particle distribution by gravity.

8. The method of claim 1, wherein said external force comprises a centrifugal force.

9. The method of claim 8, further comprising controlling an angular speed to adjust a magnitude of said centrifugal force in accordance with a target distribution of said particle distribution.

10. A method, comprising:
attaching a carrier substrate to a semiconductor chip having formed therein an integrated circuit;
providing a viscous underfill material between said carrier substrate and said semiconductor chip, said underfill material containing particles; and
controlling a distribution of said particles in said underfill material by applying an external force to obtain, at least temporarily, a collective motion of said particles towards said semiconductor chip to thereby control a thermal conductivity profile of said underfill material.

11. The method of claim 10, wherein said external force is substantially represented by gravity.

12. The method of claim 11, further comprising curing said underfill material, wherein, during curing said underfill material, said carrier substrate and said semiconductor chip are, at least temporarily, substantially vertically disposed, with said semiconductor chip being positioned below said carrier substrate.

13. The method of claim 10, wherein attaching said carrier substrate to said semiconductor chip comprises bonding said carrier substrate to said semiconductor chip by connecting bumps formed on said semiconductor chip.

14. The method of claim 13, wherein said underfill material is provided prior to connecting said bumps.

15. The method of claim 13, wherein said underfill material is filled in after bonding said carrier substrate to said semiconductor chip.

16. The method of claim 13, wherein bonding said carrier substrate to said semiconductor chip is performed with a specified spatial orientation of said carrier substrate with respect to said semiconductor chip, said method further comprising changing said specified spatial orientation for adjusting said particle distribution by gravity.

17. The method of claim 10, wherein said external force comprises a centrifugal force.

18. The method of claim 17, further comprising controlling an angular speed to adjust a magnitude of said centrifugal force in accordance with a target distribution of said particle distribution.

* * * * *